(12) United States Patent
Kinyua et al.

(10) Patent No.: US 12,081,178 B2
(45) Date of Patent: *Sep. 3, 2024

(54) AMPLIFIER WITH VCO-BASED ADC

(71) Applicant: Taiwan Semiconductor Manufacturing Company, Ltd., Hsinchu (TW)

(72) Inventors: Martin Kinyua, Cedar Park, TX (US); Eric Soenen, Austin, TX (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 75 days.

This patent is subject to a terminal disclaimer.

(21) Appl. No.: 17/869,111

(22) Filed: Jul. 20, 2022

(65) Prior Publication Data

US 2022/0368292 A1     Nov. 17, 2022

Related U.S. Application Data

(63) Continuation of application No. 16/731,256, filed on Dec. 31, 2019, now Pat. No. 11,424,724.

(51) Int. Cl.
*H03F 3/217*     (2006.01)
*H03F 1/02*      (2006.01)
(Continued)

(52) U.S. Cl.
CPC ......... *H03F 3/2175* (2013.01); *H03F 1/0233* (2013.01); *H03F 3/185* (2013.01); *H03M 3/424* (2013.01); *H03M 3/494* (2013.01)

(58) Field of Classification Search
CPC ...... H03F 3/2175; H03F 1/0233; H03F 3/185; H03F 2200/03; H03F 3/2173;
(Continued)

(56) References Cited

U.S. PATENT DOCUMENTS 6,683,494 B2    1/2004  Stanley
7,106,130 B2 *  9/2006  Gan ...................... H02M 3/156
                                                        330/10
(Continued)

FOREIGN PATENT DOCUMENTS

CN       1956320 B       11/2011
WO    2007/079396 A2      7/2007

OTHER PUBLICATIONS

Park et al., "A VCO-based Analog-to-Digital Converter with Second-Order Sigma-Delta Noise Shaping," IEEE International Symposium on Circuits and Systems, pp. 3130-3133 (2009).

*Primary Examiner* — Hieu P Nguyen
(74) *Attorney, Agent, or Firm* — MERCHANT & GOULD P.C.

(57) ABSTRACT

An amplifier includes an input circuit configured to receive an analog input signal and a feedback signal, and output an analog error signal based on the analog input signal and the feedback signal. An ADC is configured to convert the analog error signal into a digital signal in a phase domain. A digital control circuit is configured to generate a digital control signal based on the digital signal in the phase domain. An output circuit is configured to generate an amplified output signal based on the digital control signal, and a feedback circuit is configured generate the feedback signal based on the amplified output signal.

20 Claims, 7 Drawing Sheets

(51) Int. Cl.
    *H03F 3/185*   (2006.01)
    *H03M 3/00*    (2006.01)
(58) Field of Classification Search
    CPC ....... H03F 3/217; H03M 3/424; H03M 3/494;
                          H03M 1/60; H03M 3/432
    USPC .............................. 330/277, 10, 251, 207 A
    See application file for complete search history.

(56) References Cited

U.S. PATENT DOCUMENTS

| | | |
|---|---|---|
| 7,453,316 B2 | 11/2008 | Shimizu |
| 7,990,215 B2 | 8/2011 | Soenen et al. |
| 8,022,757 B2 | 9/2011 | Takagi et al. |
| 8,064,856 B2 | 11/2011 | Singerl et al. |
| 8,385,468 B2 | 2/2013 | Karthaus et al. |
| 9,319,011 B2 | 4/2016 | Kinyua et al. |
| 9,397,692 B1 * | 7/2016 | Zanbaghi .............. H03M 3/438 |
| 2012/0281550 A1 | 11/2012 | Huang |
| 2013/0127531 A1 | 5/2013 | Lesso |
| 2018/0205352 A1 | 7/2018 | McKenzie et al. |
| 2020/0382084 A1 | 12/2020 | Putzeys et al. |

* cited by examiner

AMPLIFIER WITH VCO-BASED ADC

CROSS-REFERENCE TO RELATED APPLICATIONS

This application is a continuation of U.S. application Ser. No. 16/731,256, filed Dec. 31, 2019, and titled "AMPLIFIER WITH VCO-BASED ADC," the disclosure of which is hereby incorporated herein by reference.

BACKGROUND

Amplifiers are classified based on certain operating characteristics. Class-D amplifiers, in contrast to Class-A, Class-B, or Class-AB amplifiers, use the switching modes of transistors to regulate power delivery. Class-D amplifiers are preferred for many applications because the full "on" or full "off" characteristic of the gating signals ensures that the driver portion of the circuit is very power efficient. A Class-D amplifier is often used as a low frequency amplifier due to the high efficiency and low heat dissipation characteristics. An example low frequency amplifier application is an audio amplifier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
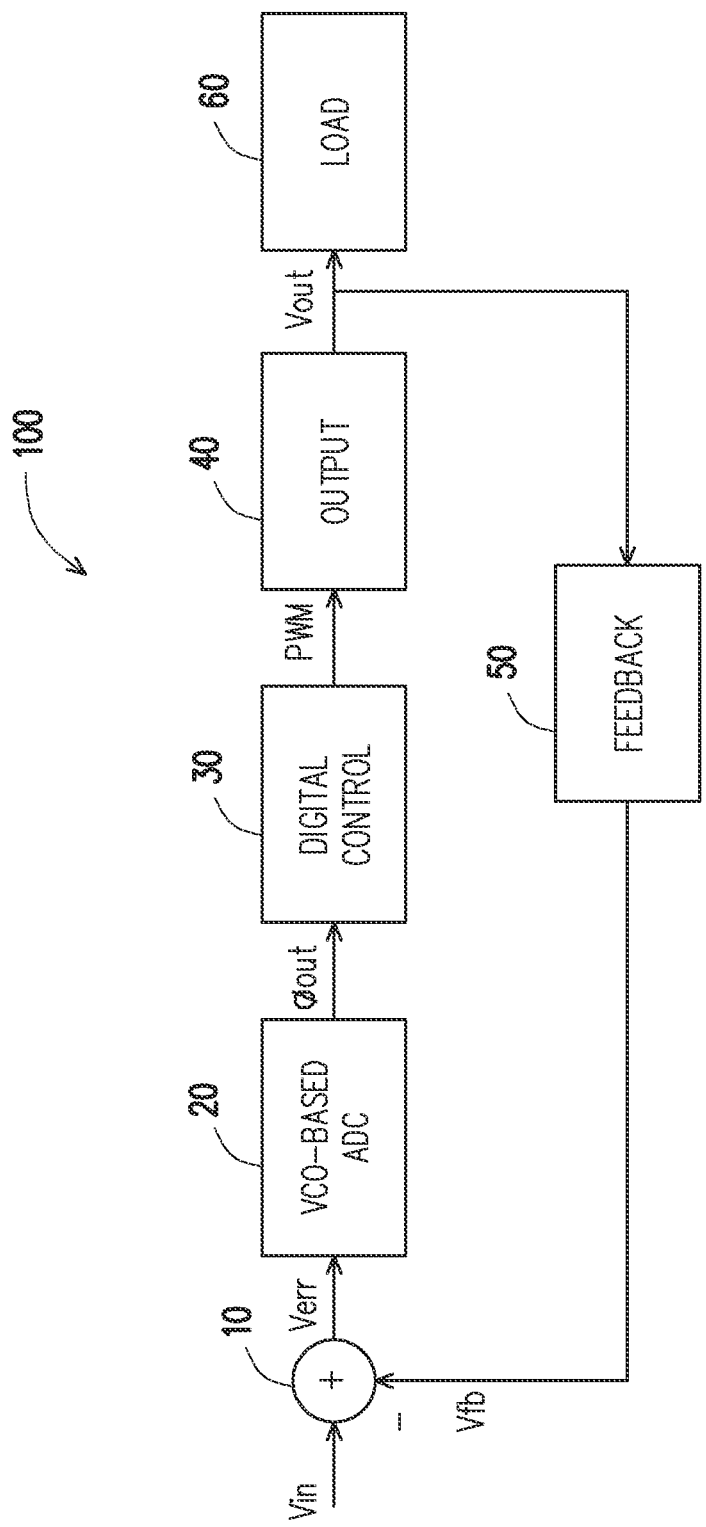
FIG. 1 is a block diagram illustrating aspects of an amplifier system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Amplifiers are classified based on certain operating characteristics. For example, class-D amplifiers use the switching modes of transistors to regulate power delivery. Class-D amplifiers are often used as a low frequency amplifier due to the high efficiency and low heat dissipation characteristics. An example low frequency amplifier application is an audio amplifier.

In some applications, analog-input Class-D amplifiers are used; however, they typically require high precision analog components and generally require complicated analog control. Analog components that are required in some analog-input Class-D amplifier applications, such as the analog integrators and the ramp generators therein, are difficult to be reliably fabricated with sufficient precision in some present day semiconductor manufacturing processes.

In some disclosed embodiments, a Class-D amplifier has an analog-to-digital converter (ADC) that allows much of the signal processing operations of the amplifier to be performed in a closed loop digital domain. ADCs convert an analog signal into a digital signal. ADC arrangements include as pipelined, flash, Delta-Signal, successive approximation register ("SAR"), etc.

In general, aspects of disclosed embodiments include an amplifier where a front-end feedback error ADC is followed by a digital loop filter, a compensation filter, a digital PWM generator and output drivers in a feedback loop. In some examples, a feedback error signal is quantized using a voltage controlled oscillator (VCO) based Delta-Sigma ADC. With a Delta-Sigma ADC, a varying analog signal is encoded into a stream of pulses. The accuracy of the modulation is improved by passing this digital output through a digital to analog converter (DAC) and subtracting the resulting analog signal from the analog input signal in a negative feedback configuration.

FIG. 1 is a block diagram illustrating aspects of an amplifier 100 in accordance with some embodiments. An input node 10 receives an analog input signal Vin and a feedback signal Vfb, and outputs an analog error signal Verr based on the analog input signal Vin and the feedback signal Vfb. An ADC 20 is configured to convert the analog error signal Verr into a digital output signal $\phi$out in a phase domain, and a digital control circuit 30 generates a pulse width modulated (PWM) signal based on the digital signal. An output circuit 40 is configured to generate an amplified output signal Vout based on the PWM signal corresponding to the first analog input signal, which is received provided to a load 60. A feedback circuit 50 is configured generate the feedback signal Vfb based on the amplified output signal. In some examples, the amplifier 100 is a class D amplifier that receives an audio signal as the analog input signal Vin, and the load 60 is a speaker that receives the amplified output Vout.

Figure 2:
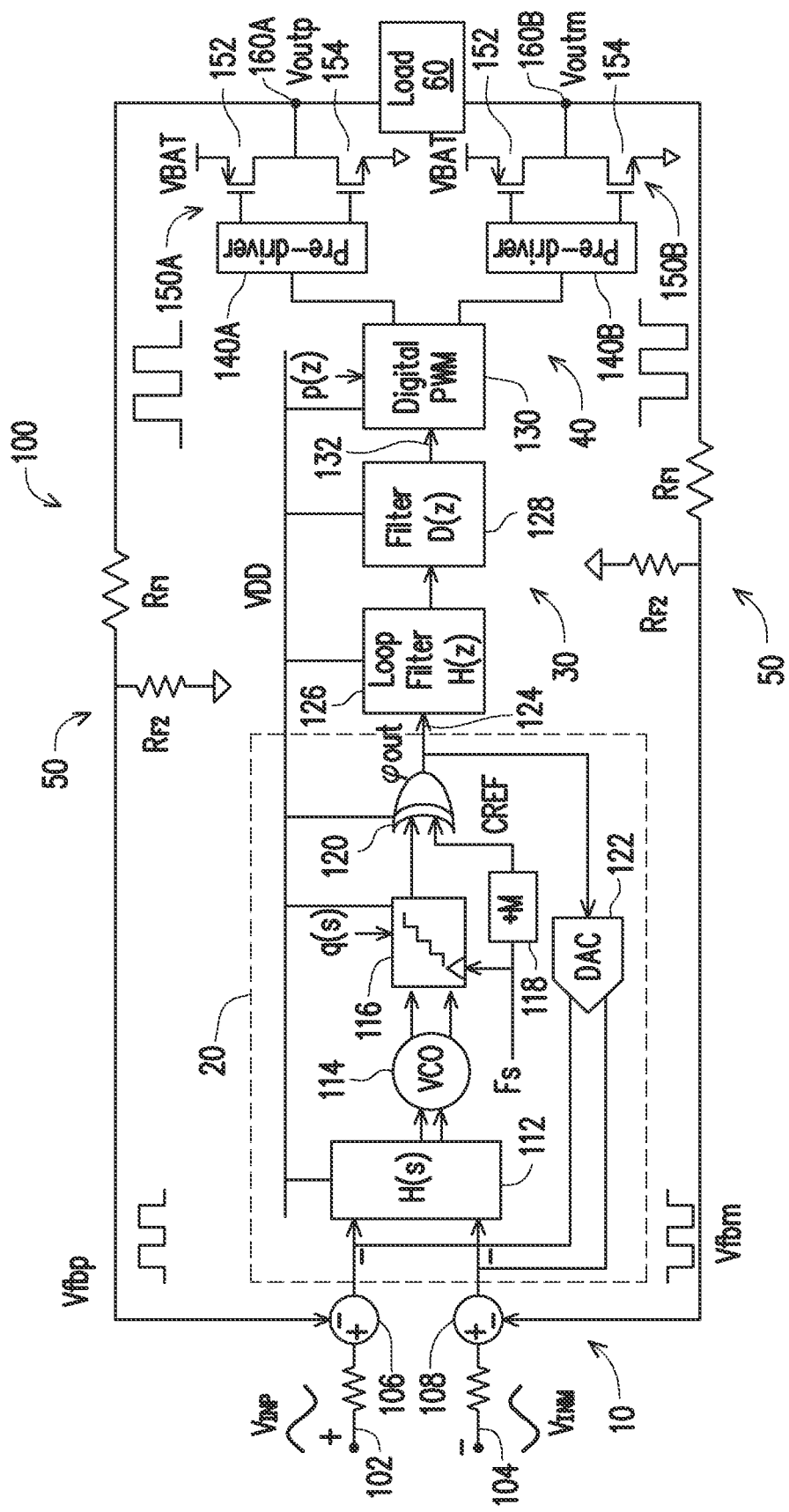
FIG. 2 is a circuit diagram illustrating aspects of an amplifier system in accordance with some embodiments.

FIG. 2 is a circuit diagram illustrating further aspects of the amplifier 100 in accordance with some embodiments. In the example shown in FIG. 2, the input signal Vin is a differential signal including first and second input signals Vinp and Vinm, and the input circuit 10 thus includes respective first and second input terminals 102, 104. First and second summation blocks 106, 108 receive the respective inputs Vinp and Vinm, as well as first and second feedback signals Vfbp, Vfpm and output respective error signals to the ADC 20.

The ADC 20 in the illustrated example is a VCO-based Delta-Sigma ADC. The VCO-based Delta-Sigma ADC 20 tends to be area and power efficient since it is constructed primarily of simple inverter structures, as will be discussed further below. It operates well under low power supply and is amenable to implementation in deep nanoscale process technologies. The ADC 20 includes an input filter 112 that receives the differential error signals, and provides an input to a voltage controlled oscillator (VCO) 114. The filter 112 has a transfer function represented by an s-domain expression H(s). A VCO is a circuit that generates an oscillating signal with a frequency controlled by an input voltage, such as the error signals received from the summation blocks 106, 108. The ADC 30 further receives a clock signal that has a sampling frequency Fs. In some embodiments, the analog input signals Vinp and Vinm have a signal bandwidth ranging from a zero frequency to a predetermined frequency Fbw, and the sampling frequency Fs is not less than a predetermined multiple of the predetermined frequency Fbw. In some embodiments, the predetermined multiple is at least 2. In some embodiments, the predetermined multiple is 64, 128, or 256. As noted previously, in some embodiments the amplifier 100 is a class-D amplifier and is thus usable for processing human-audible audio signals. As such, the predetermined frequency Fbw may range from 8 kHz to 20 kHz.

The VCO 114 outputs first and second differential frequency signals to a phase quantizer 116, which receives the sampling clock signal Fs as an input and outputs a phase signal based on the received frequency signals output by the VCO 114. The quantizer 116 output phase signal is compared to the sampling clock signal Fs and the resulting phase signal ϕout is output to the digital control circuit 30. The phase signal ϕout is also converted to an analog signal by a digital to analog converter (DAC) 122 and fed back to the input terminals of the ADC 20. More particularly, in the illustrated example, the output phase signal of the quantizer 116 is compared to a reference phase determined by a divider 118 that divides the sampling clock frequency signal Fs by a factor M. The comparison is made by an exclusive OR (XOR) gate 120 that receives the outputs of the quantizer 116 and divider 118.

The digital control circuit 30 includes an input port 124 that receives the phase signal ϕout from the ADC 20. In some embodiments, the digital control circuit 30 input port 124 is an N-bit port. The digital control circuit 30 is configured to generate a digital output signal based on the digital phase signal ϕout. In the illustrated example, the digital control circuit 30 includes a loop filter 126 followed by a compensation filter 128. The loop filter 126 has a transfer function represented by a z-domain expression H(z) and is configured to have a high gain within a predetermined frequency band, such as from the zero frequency to the predetermined frequency Fbw, and to move truncation errors of the ADC 20 and other errors out of the predetermined frequency band. The compensation filter 128 has a transfer function represented by a z-domain expression D(z) and is configured to increase stability of an overall transfer function of the amplifier 100.

In some embodiments, the transfer function H(z) of the loop filter 126 is first determined based on a design requirement regarding a magnitude or gain aspect of the transfer function of the amplifier 100. Subsequently, the transfer function D(z) of the compensation filter 128 is determined in order to introduce one or more poles or zeros to stabilize the transfer function of the amplifier 100. In some embodiments, the loop filter 126 and the compensation filter 128 refer to two separable circuit units in the amplifier 100. In some embodiments, the loop filter 126 and the compensation filter 128 are conceptual units referring to the result of two designing steps, but are still implemented by an integrated circuit. In some embodiments, the loop filter 126 and the compensation filter 128 may refer to a digital signal processing (DSP) unit executing a set of DSP instructions.

A digital pulse width modulation (PWM) unit 130 has an input port 132 that receives the output of the compensation filter 128 and is configured to generate first and second PWM signals based on the output of the compensation filter 128. In some embodiments, the first PWM signal and the second PWM signal are logically complementary to each other. In some embodiments, only one of the first PWM signal and the second PWM signal is generated.

The output circuit 40 includes first and second pre-drivers 140A, 140B that receive the respective first and second PWM outputs from the PWM generator 130. The pre-drivers 140A, 140B are configured to generate control signals based on the PWM signals, which are output to respective output drivers 150A, 150B. The output drivers 150A, 150B are configured to generate respective output signals Voutp, Voutm at output terminals 160A, 160B based on the control signals received from the pre-drivers 140A, 140B.

The output drivers 150A, 150B each include a P-type transistor 152 and an N-type transistor 154. The P-type transistors 157A each have a source terminal coupled to a VBAT power supply node, a drain terminal coupled to the respective output nodes 160A, 160B, and a gate terminal coupled to the outputs of the respective pre-derivers 140A, 140B. The N-type transistors 154 each have a source terminal coupled to a ground terminal, a drain terminal coupled to the respective output nodes 160A, 160B, and a gate terminal coupled to the output of the respective pre-derivers 140A, 140B. In some embodiments, the control signals output by the pre-drivers 140A, 140B are configured to control the transistors 152, 154 according to the PWM signal from the PWM generator 130. Therefore, the output signals from the output drivers 150A, 150B are also PWM signals switching between a high voltage level equal to the VBAT voltage level and a low voltage level equal to ground.

The output signals Voutp, Voutm on the output terminals 160A, 160B are electrically coupled to the load 60 and are usable to drive the load 60. In some embodiments, the load 60 includes a loudspeaker. In some embodiments, the load 60 further includes a low-pass filter.

The output signals Voutp, Voutm are also fed back respectively to the summation blocks 106, 108 through the feedback circuit 50 that includes respective resistive networks that function as voltage dividers. The resistive networks include first and second feedback resistors RF1, RF2. The first feedback resistors RF1 are coupled between respective output nodes 160A, 160B and the summation blocks 106, 108. The second feedback resistors RF2 are coupled between the summation blocks 106, 108 and ground. The feedback signals Vfbp, Vfbm are thus also PWM signals based on the Voutp, Voutm output signals.

The feedback path for the output signals Voutp, Voutm is therefore defined as from the output nodes 160A, 160B, through the resistive networks including RF1, RF2 to the summation blocks 106, 108 of the input node 10. In some embodiments, the feedback path is free from a low-pass filtering device that has a cutoff frequency lower than a sampling frequency FS of the ADC. In some embodiments, other than the parasitic capacitance comes with the electrical features in the feedback path, there is no more capacitive devices, such as metal-oxide semiconductor (MOS) capacitors, metal-insulator-metal (MIM) capacitors, or capacitors external to the integrated circuit chip that contains the amplifier 100, electrically coupled with the feedback path.

As a result, within a frequency band no greater than the sampling frequency FS, the feedback path only scales the output signals Voutp, Voutm to a voltage level acceptable to the ADC 20 by a resistive network without any additional analog circuit analysis or any additional areas for energy-storing capable devices, such as capacitive devices or inductive devices. The signal processing operations would be primarily performed in the digital domain, and the need for precise analog circuits is reduced or eliminated. The loop characteristics of the amplifier 100 is primarily determined by the digital control circuit 30, where the gain, poles, and zeros are suitable to be implemented by first, second, or higher order loops in the digital domain without the limitations of analog circuits, such as vulnerability to process variations, noise, and limited achievable gain. In some embodiments, the in-band loop gain of the amplifier 100 is suitable to be made arbitrarily (>100 dB) to effectively suppress non-linearities of the PWM generator 130 and output drivers 40 and attain sufficient Power Supply Rejection (PSR). The in-band loop gain includes the gain of the ADC 20, loop filter gain, compensation filter 126 gain, PWM generator 130 gain and a feedback factor (e.g. 0.4 in some examples).

The illustrated amplifier 100 has a differential-mode configuration usable to process the pair of differential analog input signals Vinp, Vinm, and output a pair of output signals Voutp, Voutm. In some embodiments, the amplifier 100 is modifiable to have a single-ended-mode configuration to process a single-ended analog signal. In such embodiments, the 20 is configured to receive a reference signal and an analog signal, such as one of the analog signals Vinp and Vinm. As such, only one of the output signals Voutp, Voutm is generated, and only one of the pre-drivers 140A, 140B and output drivers 150A, 150B are required.

Figure 3:
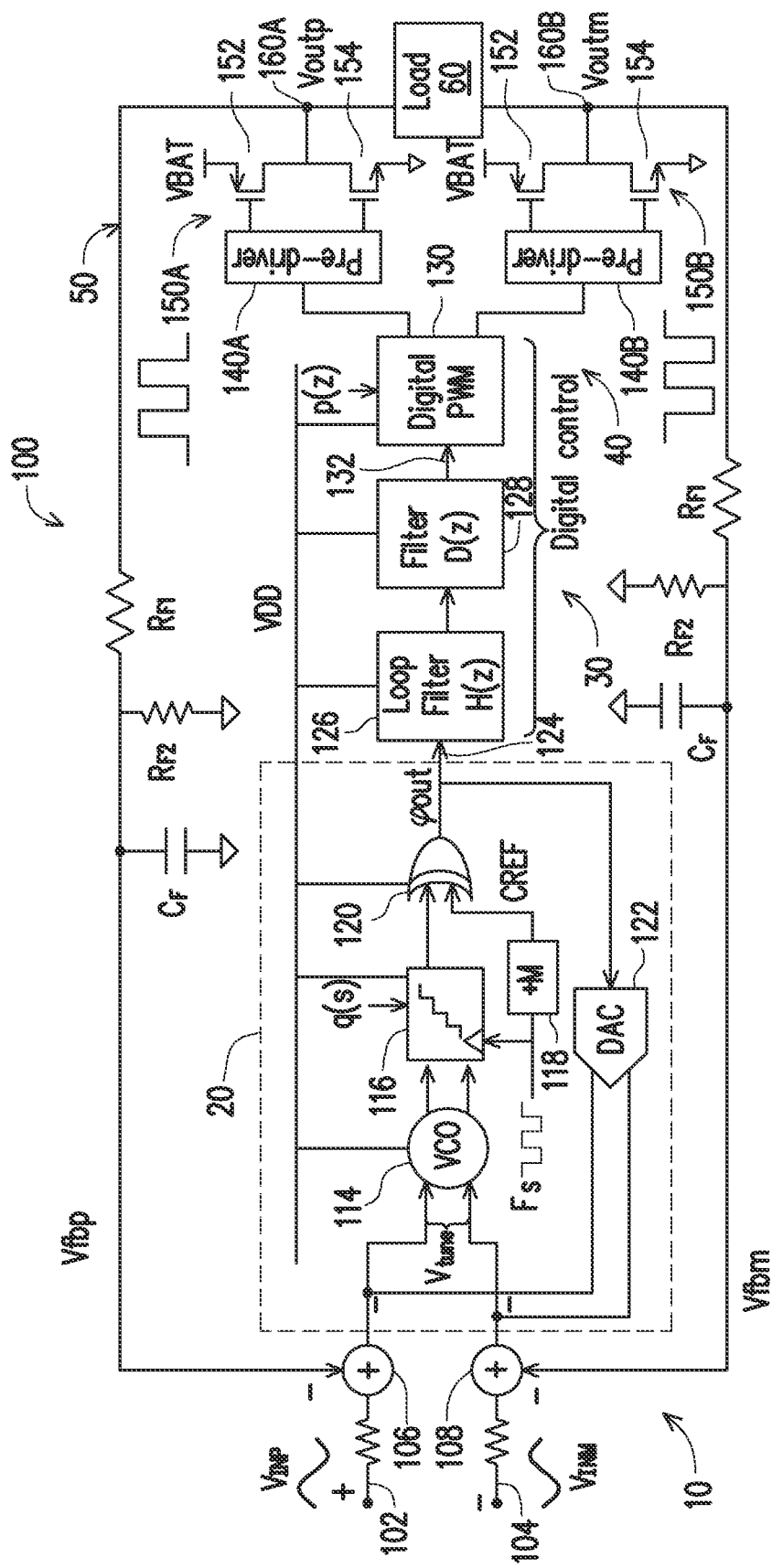
FIG. 3 is a circuit diagram illustrating aspects of an amplifier system in accordance with some embodiments.

FIG. 3 illustrates another embodiment of the amplifier 100. In the embodiment of Figure, the digital control 30 and the output circuit 40 are similar to that disclosed in conjunction with the embodiment shown FIG. 2. These elements are therefore not addressed in detail in the discussion of FIG. 3. In the example of FIG. 3, the feedback circuit 50 includes filtering capacitors CF in addition to the resistive network comprising the resistors RF1, RF2. The filtered PWM feedback signals from the output nodes 160A, 160B is received by the summation blocks 106, 108. Since the feedback circuit 50 includes the filtering capacitors CF, the input filter 112 of the embodiment shown in FIG. 2 is omitted.

The embodiment shown in FIG. 3 also employs a front-end error ADC 20 that is implemented as a VCO-based Delta-Sigma topology. The error signals output by the summation blocks 106, 108 in FIG. 3 is designated Vtune, and is received by the VCO 114. Because the range of the input signal Vtune to the VCO 114 is relatively small and substantially de-correlated from the output signals Voutp, Voutm, the impact of any VCO voltage-to-frequency non-linearity is essentially eliminated.

As noted above, the quantizer 116 phase is compared to a reference phase by the XOR gate 120. The reference phase is obtained by dividing the sampling clock frequency Fs by the factor M, which output by the divider 118 to the XOR gate 126. The resulting error signal at the output node 124 is fed back through the DAC 122 to the input of the VCO 114. Effectively, this feedback loop corresponds to a first-order continuous time ADC loop, and contains an integrator with infinite DC gain (as supplied by the VCO 114).

Because phase is the integral of frequency, the tuning voltage of the phase-based VCO quantizer 116 can be confined to a very small operating region (for example, less than 50 mV) while still enabling a complete exercise of its dynamic range. As such, any impact of the VCO 114 voltage-to-frequency nonlinearity is substantially reduced by using phase as the output variable of the ADC 20.

Figure 4:
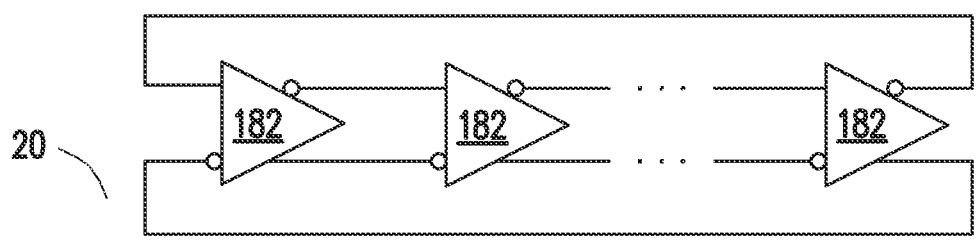
FIG. 4 is a circuit diagram of an example of a ring oscillator in accordance with some embodiments.

The VCO 114 generates an oscillating signal with a frequency controlled by the input voltage Vtune. FIG. 4 illustrates an example of a ring oscillator 180 employed in embodiments of the VCO 114. The ring oscillator 180 includes a series of inverters 182 connected in cascade. Oscillation is obtained if a phase shift of 180 degrees in total is achieved to form a positive feedback. Each inverter 182, also referred to as a delay cell, has an associated intrinsic delay, and the sum of the intrinsic delays of all of the inverters 182 makes the circuit oscillate at a certain frequency. In embodiments where a differential control signal is used, an even or odd number of the inverters 182 may be used to achieve oscillation. In single-ended embodiments where a single input signal is received, an odd number of inverters 182 is used to achieve oscillation. Tuning of the ring oscillator may be achieved by varying a voltage supply controlling the current of the inverters.

Figure 5:
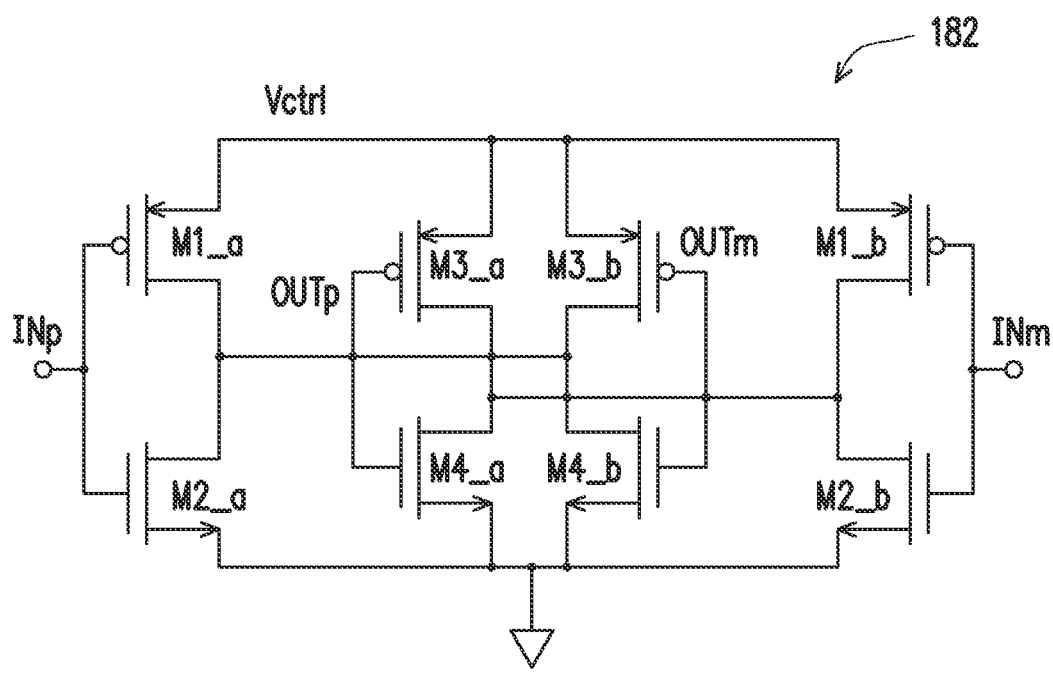
FIG. 5 is a circuit diagram of an example of a delay cell for a ring oscillator in accordance with some embodiments.

In some embodiments, the ring oscillator uses a simple inverter structure and thus provides a compact and low power circuit. FIG. 5 illustrates an example of a circuit implementing the ring oscillator inverters, or delay cells 182. The delay cell 182 circuit receives differential inputs signals INp, INm and generates output signals OUTp, OUTm. Each of the differential sides of the inverter 182 includes two inverter-connected PMOS and NMOS transistor pairs. More specifically, in the illustrated examples the positive input signal INp side has transistor pairs M1_a/M2_a, M3_a/M4_a, while the negative signal INm input side has transistor pairs M1_b/M2_b, M3_b/M4_b connected to invert their respective inputs INp, INm to output inverted outputs OUTp, OUTm.

Figure 6:
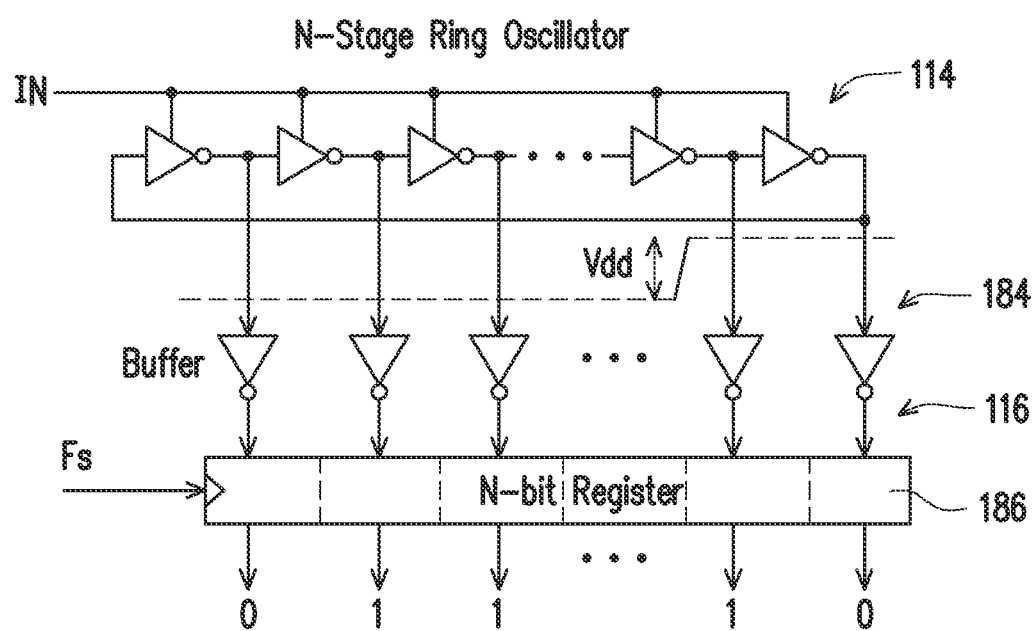
FIG. 6 is a circuit diagram of an example of a quantizer in accordance with some embodiments.

FIG. 6 illustrates an example of the VCO based quantizer 116. As noted above, in some embodiments the digital control circuit 30 includes an N-bit input port 124 that receives the phase signal ϕout from the ADC 20. Accordingly, the VCO 114 provides an N-bit output to a buffer 184 connected to an N-bit register 186. The VCO 114 receives an input signal IN, such as the Vtune input signal shown in FIG. 3. The quantizer 116 operates with time as its key signal, and thus receives the sampling frequency clock signal Fs as an input. The quantizer 116 is configured to achieve multiple quantization levels by leveraging the variable delays of the stages of the VCO 114. The VCO 114 effectively translates the input voltage IN to a time signal through its voltage-to-frequency characteristic, wherein a higher input signal IN translates to higher oscillator frequencies and, therefore, shorter delays, and low input voltages IN translate to lower oscillator frequencies and, therefore, longer delays. A quantized version of the voltage input IN is obtained by counting the number of edges that transition in a given reference clock period.

Thus, examples of the VCO-based quantizer 116 provide various area and power consumption advantages. For instance, the output voltages of the VCO delay stages (inverters) will, to a first order, saturate to either supply or ground with the exception of the delay stage output that is in transition. This output signal property remains true as the number of delay stages increases for the most part. As such, the disclosed VCO-based quantizer 116 may be very compact and achieve high speed operation without requiring high power consumption.

Figure 7:
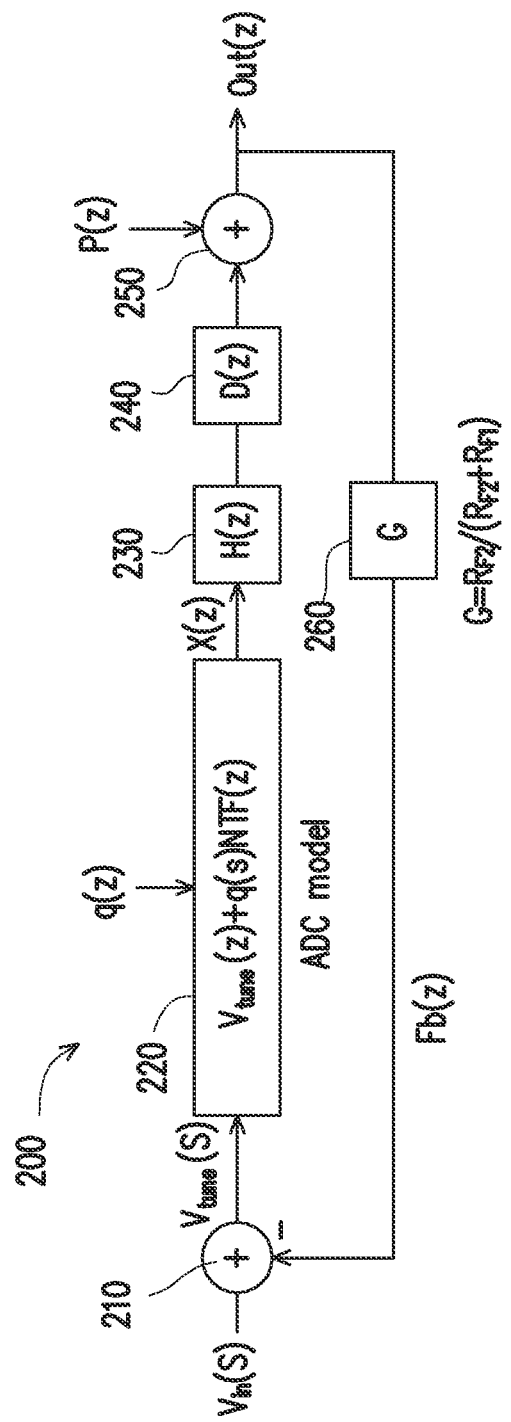
FIG. 7 is a Z-domain block diagram of a Class-D amplifier in accordance with some embodiments.

FIG. 7 is a Z-domain block diagram 200 of a Class-D amplifier in accordance with some embodiments. The Z-domain block diagram 200 illustrates various signals and transfer functions of various components in a Class-D amplifier, such as the amplifier 100 disclosed herein. The Z-domain block diagram 200 includes a first summation block 210, an ADC transfer function block 220, a loop filter transfer function block 230, a compensation filter transfer function block 240, a second summation node 210, and a feedback block 260.

The summation node 210 combines the input signal Vin(s) having a z-domain expression Vin(z), and an inverted version of a feedback signal, having a z-domain expression Fb(z), and generates the error signal Vtune(s), having a z-domain expression Vtune(z). The Input signal Vin(s) corresponds to the Z-domain expression of the input signals Vinp and Vinm. The ADC transfer function block 220 corresponds to the operation of the ADC 10 shown in the examples of FIG. 3, which converts the error signal Vtune(s) into a digital signal x(z). The ADC transfer function block 220 introduces a quantization error q(s), which is further processed by a noise transfer function NTF(z). In other words, the digital signal x(z) meets the following equation:

$$x(z)=Vtune(z)+q(s)NTF(z).$$

In some embodiments, NTF(z) meets the following equations:

$$NTF(z)=(1-z^{-1})^M, \text{ and } M \text{ is a positive integer.}$$

The loop filter transfer function block 230 corresponds to the loop filter 126 and has a transfer function H(z). The compensation filter transfer function block 240 corresponds to the compensation filter 128 and has a transfer function D(z). The loop filter transfer function block 230 and the compensation filter transfer function block 240 convert the digital signal x(z) into a digital signal y(z), which meets the following equation:

$$y(z)=x(z)H(z)D(z).$$

In some embodiments, H(z) meets the following equations:

$$H(z) = \frac{1}{1-z^{-1}} G_1.$$

and $G_1$ is a positive real number.

In some embodiments, D(z) has an equivalent Laplace transfer function D(s) that meets the following equations:

$$D(s) = \frac{s+z_1}{(s+p_1)(s+p_2)} G_2,$$

and $G_2$ is a positive real number, $z_1$ is a zero in the Laplace-domain, and $p_1$ and $p_2$ are poles in the Laplace-domain.

The summation block 250 combines the digital signal y(z) and a PWM error signal P(z) to become output signal Out(z). The PWM error signal P(z) corresponds to the quantization error introduced by the digital PWM generator 130 and/or other errors attributable to the pre-driver units 140A/140B and output drivers 150A/150B. The output signal Out(z) corresponds to the Z-domain expression of the output signals Voutp and Voutm. Therefore, the summation block 250 corresponds to the digital PWM generator 130, the pre-driver units 140A/140B, or the output drivers 150A/150B.

The feedback block 260 has a gain factor G. The feedback block 260 corresponds to the feedback circuit 50. In some embodiments, the gain factor G corresponds to a ratio of a resistance value of the resistor RF2 to a total resistance value of resistors RF1 and RF2. For example, if the resistor RF1 has a resistance value of $R_1$, resistor RF2 has a resistance value of $R_2$, the gain factor G meets the following equation:

$$G=R_2/(R_1+R_2).$$

Therefore, the overall transfer function is:

$$Out(z) = \frac{H(z)D(z)}{1+H(z).D(z)G}Vin + \frac{H(z)D(z)}{1+H(z).D(z)G}NTF(z)q(z) + \frac{1}{1+H(z).D(z)G}P(z)$$

Figure 8:
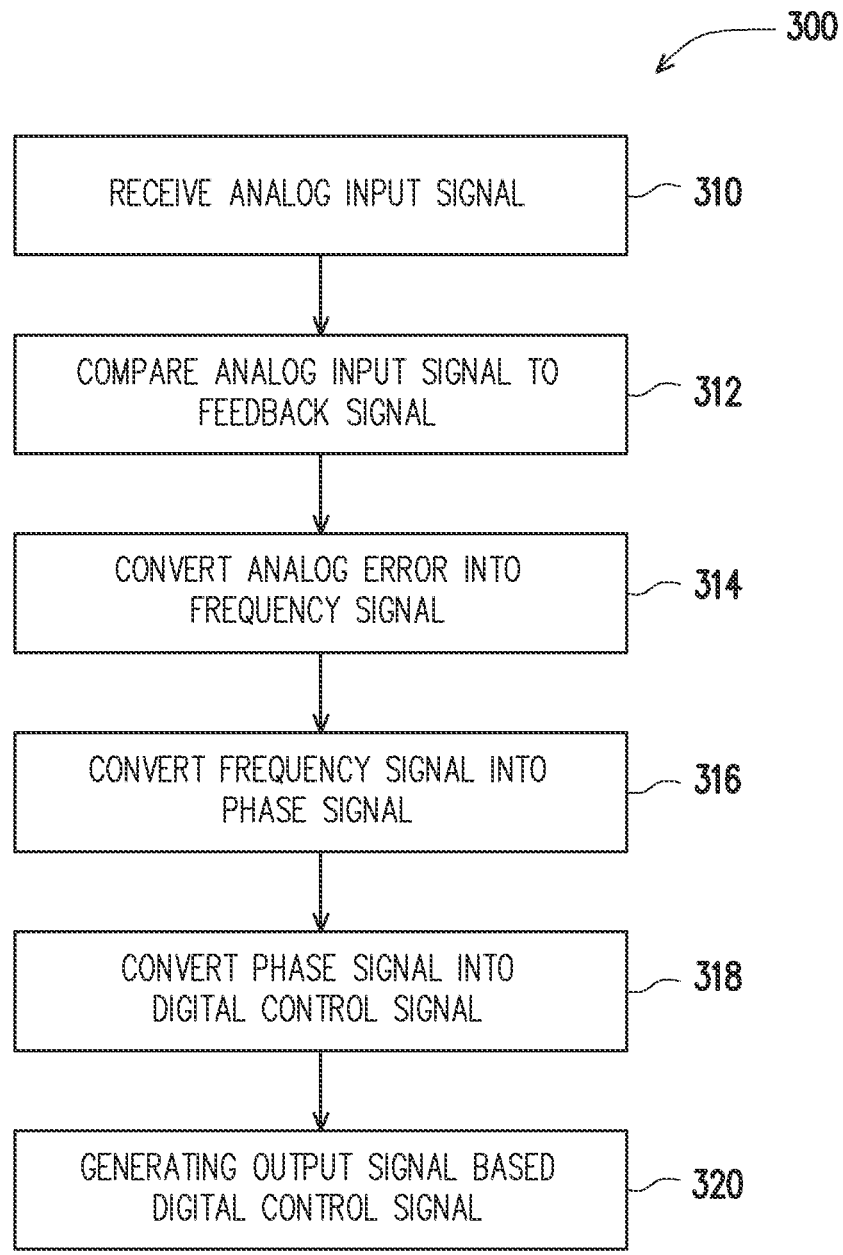
FIG. 8 is a flow diagram illustrating a method in accordance with some embodiments.

FIG. 8 is a flow chart illustrating a method 300 in accordance with disclosed embodiments. Referring to FIG. 8 along with FIGS. 1-3, the method 300 includes receiving an analog input voltage signal Vin in step 310. The analog input signal Vin is compared to a feedback signal Vfb to determine an analog error signal Vtune in step 312. In step 314, the analog error signal Vtune is converted into a frequency signal based on the analog error signal using a VCO-based Sigma-Delta ADC 10, for example. The frequency signal is converted into a phase signal in step 316, by a phase quantizer 116, for example. In some examples, the frequency signal is compared to a reference frequency signal FS to determine the phase signal. In step 318, the phase signal is converted into a digital control signal, such as a PWM signal, based on the phase signal. An output signal based the digital control signal is then generated in operation 320. In some examples, the output signal is scaled and filtered to generate the feedback signal.

In accordance with some disclosed examples, an amplifier circuit employs a VCO based Delta-Sigma ADC, which is constructed with simple inverters to provide a simple design that is area and power efficient. Signal processing in disclosed examples is primarily digital, eliminating complex analog circuitry associated with traditional designs.

In accordance with some disclosed embodiments, an amplifier, which may be a class D amplifier, includes an input circuit configured to receive an analog input signal and a feedback signal, and output an analog error signal based on the analog input signal and the feedback signal. An ADC is configured to convert the analog error signal into a digital signal in a phase domain. A digital control circuit is configured to generate a digital control signal based on the digital signal in the phase domain. An output circuit is configured to generate an amplified output signal based on the digital control signal, and a feedback circuit is configured generate the feedback signal based on the amplified output signal.

In accordance with other embodiments, a circuit includes an input circuit configured to receive an analog input signal and a feedback signal, and output an analog error signal based on the analog input signal and the feedback signal. An ADC including VCO is configured to receive the analog error signal and output a frequency signal based on the analog error signal. A quantizer is configured to receive the frequency signal and compare the frequency signal to a reference signal to output a phase signal based on the frequency signal. A digital control circuit is configured to receive the phase signal and output a pulse width modulated (PWM) signal based on the phase signal.

In accordance with further embodiments, a method includes receiving an analog input voltage signal, comparing the analog input signal to a feedback signal to determine an analog error signal and converting the analog error signal into a frequency signal based on the analog error signal. The frequency signal is converted into a phase signal, including comparing the frequency signal to a reference signal. Converting the phase signal into a digital control signal based on the phase signal. An output signal is generated based the digital control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An amplifier, comprising:
   an input filter configured to receive an analog error signal;
   a voltage controlled oscillator (VCO) having an input terminal connected to an output of the input filter;
   a phase quantizer connected to an output terminal of the VCO;
   a digital to analog converter having an input terminal connected to an output terminal of the phase quantizer and an output terminal connected to the input filter;
   a digital control circuit having an input terminal connected to the output terminal of the phase quantizer;
   an output driver having an input terminal connected to an output terminal of the digital control circuit and configured to generate an amplified output signal.

2. The amplifier of claim 1, further comprising an input circuit configured to receive an analog input signal and a feedback signal, and output the analog error signal based on the analog input signal and the feedback signal to the input filter.

3. The amplifier of claim 2, further comprising an analog-to-digital converter (ADC) configured to convert the analog error signal into a digital signal in a phase domain.

4. The amplifier of claim 3, wherein the digital control circuit is configured to generate a digital control signal based on the digital signal in the phase domain.

5. The amplifier of claim 1, wherein the phase quantizer is configured to compare the phase signal output by the VCO to a reference frequency.

6. The amplifier of claim 5, wherein the phase quantizer includes an exclusive OR (XOR) gate configured to receive the phase signal and the reference signal as inputs.

7. The amplifier of claim 1, wherein the digital control circuit includes a digital filter configured to receive the phase signal.

8. The amplifier of claim 7, wherein the digital filter includes a loop filter having an equivalent Laplace transfer function with at least one zero and one pole.

9. The amplifier of claim 1, further comprising a feedback circuit configured to output the feedback signal, the feedback circuit including a voltage divider.

10. The amplifier of claim 9, wherein the feedback circuit includes a filter.

11. The amplifier of claim 3, wherein the DAC is configured to convert the digital signal in the phase domain into an analog feedback signal received by the VCO.

12. The amplifier of claim 1, wherein the analog input signal is a differential input signal, and wherein the amplified output signal is a differential output signal.

13. The amplifier of claim 2, wherein the VCO is configured to receive the analog error signal directly from the input circuit.

14. The amplifier of claim 1, wherein the amplifier is a Class D amplifier.

15. A circuit, comprising:
   an input circuit configured to receive an analog input signal and a feedback signal, and output an analog error signal based on the analog input signal and the feedback signal;
   an analog-to-digital converter (ADC) including a voltage controlled oscillator (VCO) configured to receive the analog error signal and output a frequency signal based on the analog error signal;
   a quantizer configured to receive the frequency signal and compare the frequency signal to a reference signal to output a phase signal based on the frequency signal;
   an exclusive OR (XOR) gate configured to receive the phase signal and the reference signal as inputs; and
   an output driver configured to generate an amplified output signal based on an output of the XOR gate.

16. The circuit claim 15, further comprising a digital control circuit configured to receive the phase signal and output a pulse width modulated (PWM) signal based on the phase signal, wherein the output driver is configured to generate the amplified output signal based on the PWM signal.

17. The circuit claim 15, wherein the ADC includes a Delta-Sigma ADC, and wherein the Delta-Sigma ADC includes a digital-to-analog converter (DAC) configured to convert the phase signal into an analog feedback signal.

18. A method, comprising:
   converting an analog error signal into a frequency signal with a voltage controlled oscillator (VCO);
   converting the frequency signal into a phase signal, including comparing the frequency signal to a reference signal;
   generating a PWM signal based on the phase signal;
   generating an output signal based the PWM signal; and
   filtering the output signal to generate a feedback signal.

19. The method of claim 18, further comprising comparing an analog input signal to the feedback signal to determine the analog error signal.

20. The method of claim 18, further comprising converting the phase signal into a digital control signal based on the phase signal.

* * * * *